(12) United States Patent
Gorcea et al.

(10) Patent No.: US 6,323,733 B1
(45) Date of Patent: Nov. 27, 2001

(54) HIGH EFFICIENCY DUAL SUPPLY POWER AMPLIFIER

(75) Inventors: Dan V. Gorcea, Kanata; David W. Foster, Ottawa; Kevin R Parker, Nepean, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/537,721

(22) Filed: Mar. 30, 2000

(51) Int. Cl.[7] ........................................ H03F 3/26
(52) U.S. Cl. ............................. 330/297; 330/276
(58) Field of Search ........................... 330/255, 276, 330/297

(56) References Cited

U.S. PATENT DOCUMENTS

| | | | |
|---|---|---|---|
| 4,004,091 | 1/1977 | Marley et al. | 178/70 |
| 4,205,274 * | 5/1980 | Tsukada | 330/276 |
| 4,384,356 | 5/1983 | Beerbaum | 375/36 |
| 5,631,595 | 5/1997 | Lakshmikumar | 327/362 |
| 6,028,486 * | 2/2000 | Andre | 330/297 |

* cited by examiner

Primary Examiner—Steven J. Mottola
(74) Attorney, Agent, or Firm—Kent Daniels; Swabey Ogilvy Renault

(57) ABSTRACT

A power amplifier receives an input analog signal and generates a corresponding power amplified output analog signal. The power amplifier includes first and second power supply rails, an amplifier circuit, and a switch circuit. The first and second power supply rails are capable of supplying power having respective first and second predetermined levels, and a single predetermined polarity. The amplifier circuit is connected to receive the input analog signal and adapted to generate the output analog signal. Finally, the switch circuit is adapted to selectively connect one of the first and second power supply rails to the amplifier circuit.

20 Claims, 3 Drawing Sheets

HIGH EFFICIENCY DUAL SUPPLY POWER AMPLIFIER

CROSS-REFERENCE TO RELATED APPLICATIONS

This is the first application filed for the present invention.

MICROFICHE APPENDIX

Not Applicable.

TECHNICAL FIELD

The present invention relates in general to power amplifier circuits, and in particular to a high efficiency power amplifier useable as a line driver within a modem for transmitting modulated analog signals.

BACKGROUND OF THE INVENTION

Most users of data communications services access data communications networks (e.g. the Internet) using dial-up connections established through the Public Switched Telephone Network (PSTN). The PSTN is still substantially an analog communications network, designed to transmit sounds in the audible range of the human voice.

Digital data is transported across the PSTN by converting the data into an analog signal that is transmitted by varying, or modulating, the frequency, phase, amplitude or other characteristic of a carrier signal. The analog signal is then transmitted over a standard telephone line (referred to as a "local loop") using a power amplifier (e.g. a line driver), that operates to amplify the power of the analog signal.

For high speed data transmission, the use of multi-carrier (e.g., Discrete Multitone (DMT)) modulation schemes in Digital Subscriber Line (DSL) modems is well known. In DMT systems, an input bit stream is first serial-to-parallel converted. The parallel output is then grouped into N groups of bits corresponding to the number of bits per symbol. Portions of bits are allocated to each DMT carrier or sub-channel. The power transmitted over each sub-channel is preferably approximately the same.

In typical multi-carrier modulation systems, the modulation output approximates a normal distribution, with the result that the peak-to-Root Mean Squared (RMS) ratio of the output analog signal is relatively high. Because of this high ratio, the line driver must have high supply voltages (+Vc and −Vc) in order to adequately transmit the occasional high signal peaks without "clipping" or other distortion. However, such high supply voltages result in substantial power dissipation in the line driver. In fact, in a typical Digital Subscriber Line (DSL) modem, the efficiency of the line driver may be as low as 10%.

The efficiency of the line driver can be improved by dynamically changing the level of the supply voltages between a high level (+/−VH) and a low level (+/−VL) in response to changes in the level of the input analog signal. The goal of this strategy is to minimize the voltages supplied to the line diver when the level of the input signal is at a low (approximately RMS) level. Most of the time, therefore, the line driver will be supplied by the low level (+/−VL) voltage. When a signal peak must be transmitted, the supply voltages are switched to their respective high levels (+/−VH) to minimize clipping or other distortion of the signal peak.

U.S. Pat. No. 6,028,486, which issued to André on Feb. 22, 2000, teaches a system in which a dual supply amplifier is connected to a high voltage power supply and a low voltage power supply. A switch is provided to enable the dual supply amplifier to operate on the basis of a selected one of the high voltage and lower voltage power supplies. In one embodiment, a pair of amplifier circuits are provided, each of which is supplied by a respective one of the high and low voltage power supplies. The switch is then connected between respective outputs of each of the amplifier circuits and the output of the dual supply amplifier, and operates to connect the output of a selected one of the amplifier circuits to the dual supply amplifier output. In another embodiment, a single amplifier circuit is provided and the switch is connected between the high and low power supplies and the single amplifier. In this case, the switch operates to selectively connect one of the high and low power supplies to the amplifier.

In each of the above embodiments, the switch is controlled by a control signal which is generated on the basis of a comparison between the input signal level and a predetermined threshold. As a result, when the input analog signal is at a low (RMS) value, the control signal operates the switch so that the dual supply amplifier is powered by the low voltage power supply. However, when a signal peak arrives at the dual supply amplifier, the control signal operates the switch so that the dual supply amplifier is powered by the high voltage power supply.

A disadvantage of known systems, as exemplified by the system of U.S. Pat. No. 6,028,486, is that two supply rails (one each for positive and negative voltages) must be used to connect each power supply to the line driver. In a dual supply amplifier system, this means that four supply rails are needed. Typically, a line card (e.g. such as may be used at a central office) will be provided with multiple modems, each having at least one respective line driver. In order to minimize crosstalk between the modems, separate supply rails must be furnished for each line driver. Supplying four separate supply rails to each line driver consumes limited space on the line card, which in turn reduces the number of modems that can be located on a single card, and also tends to complicate the design of the card.

Accordingly, a dual supply line driver which can be conveniently fabricated on a line card having multiple modems remains highly desirable.

SUMMARY OF THE INVENTION

An object of the present invention is to provide a dual supply power amplifier circuit which requires only two power supply rails.

Accordingly, an aspect of the invention provides a power amplifier for receiving an input analog signal and generating a corresponding output analog signal. The power amplifier includes first and second power supply rails, an amplifier circuit, and a s witch circuit. The first and second power supply rails are capable of supplying power having respective first and second predetermined levels, and a single predetermined polarity. The amplifier circuit is connected to receive the input analog signal and adapted to generate the output analog signal. Finally, the switch circuit is adapted to selectively connect one of the first and second power supply rails to the amplifier circuit.

A further aspect of the invention provides a modem including a modulator for generating a modulated analog signal; and a line driver responsive to the modulated analog signal to generate a transmission signal Tx for transmission over a communications network. The line driver is a power amplifier which includes first and second power supply rails, an amplifier circuit, and a switch circuit. The first and second power supply rails are capable of supplying power having respective first and second predetermined levels, and a single predetermined polarity. The amplifier circuit is connected to receive the input analog signal and adapted to generate the output analog signal. Finally, the switch circuit is adapted to selectively connect one of the first and second power supply rails to the amplifier circuit.

Preferably, the first predetermined level corresponds to a low voltage, and the second predetermined level corresponds to a high voltage.

The amplifier circuit preferably includes a push-pull circuit connected to receive the input analog signal; and an output transformer comprising a primary winding and a secondary winding. The primary winding is connected to the push-pull circuit, and selectively connectable to one of the first and second power supply rails via the switch circuit. The secondary winding is connected to the signal line for generating the output analog signal.

The push-pull circuit may comprise an input amplifier connected to receive the input analog signal, and a pair of output transistors. The input amplifier may include an inverting output and a non-inverting output for generating respective inverted and non-inverted analog signals. A first one of the output transistors may be connected to the non-inverting output of the input amplifier, and the other one of the output transistors may be connected to the inverting output of the input amplifier.

In embodiments of the invention, the primary winding of the output transformer comprises a pair of end taps and a center tap. In this case, each end tap is connected to a collector of a respective one of the output transistors. The center tap is selectively connectable to one of the first and second power supply rails via the switch circuit.

Preferably the switch circuit is responsive to a control signal to selectively connect one of the first and second power supply rails to the amplifier circuit.

The control signal is preferably based on a comparison between a level of the input analog signal and a predetermined threshold level. The switch circuit is preferably adapted to connect the first power supply rail to the amplifier circuit when the level of the input analog signal is below the predetermined threshold, and to connect the second power supply rail to the amplifier circuit when the level of the input analog signal is above the predetermined threshold.

The control signal may be generated by a comparator circuit adapted to compare the level of the input analog signal to the predetermined threshold level.

In embodiments of the invention, the switch circuit comprises: a diode connected between the first power supply rail and the amplifier circuit; and a transistor having a base connected to receive the control signal, an emitter connected to the second power supply rail, and a collector connected to the amplifier circuit.

An advantage of the present invention is that only two supply rails (at the same polarity but differing voltage levels) are required to enable dual-supply power amplification of an alternating current (AC) input analog signal. This facilitates construction of a high efficiency modem with fewer power supply rails than the prior art, thereby simplifying line card lay-out design, and increasing the number of modems that can be placed on a single card.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
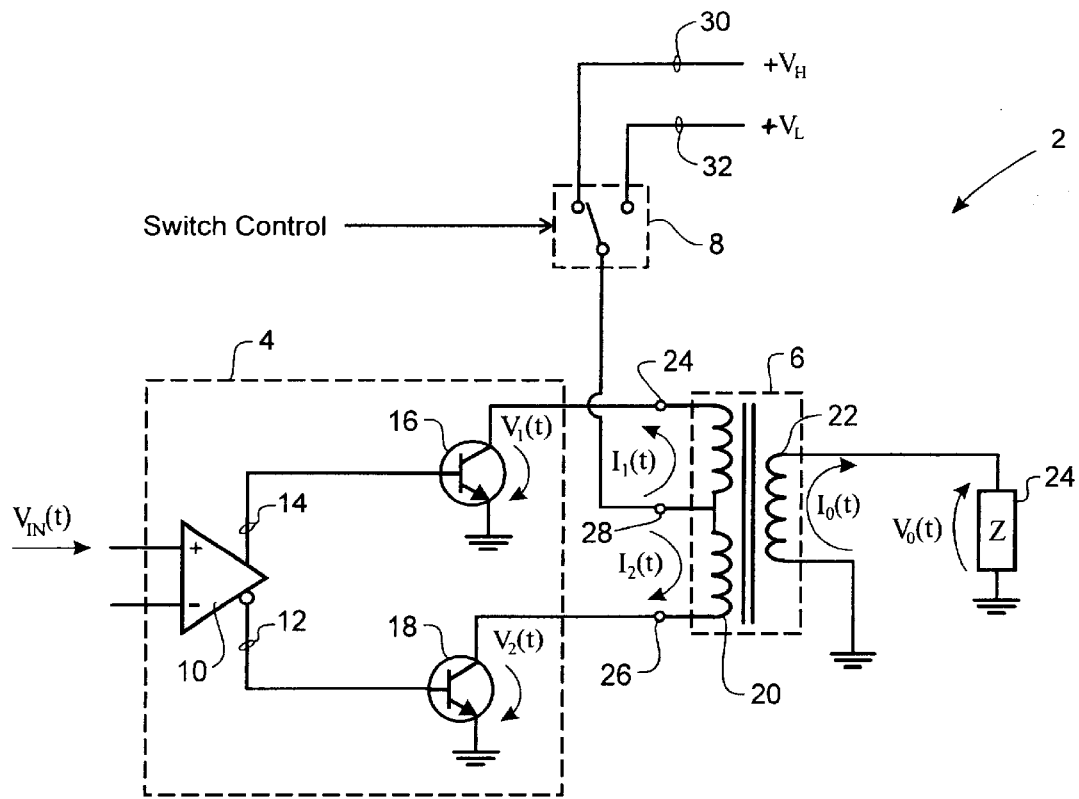
FIG. 1 is a schematic diagram illustrating a dual supply power amplifier in accordance with an embodiment of the present invention.

The present invention provides a dual supply power amplifier 2 which may, for example, be used as a line driver in a modem (e.g. a DSL modem), or in a radio system (e.g. a cellular communications network). As shown in FIG. 1, the dual supply amplifier 2 generally comprises a push-pull circuit 4, an output transformer 6, and a switch circuit 8. The push-pull circuit 4 generally comprises an input amplifier 10 which is connected to receive a modulated analog input signal and produce inverted and non-inverted analog signals on respective inverted and non-inverted outputs 12,14 of the input amplifier 10. The non-inverted analog signal is supplied to the base of a first output transistor 16. Similarly, the inverted analog signal is supplied to the base of a second output transistor 18. With this arrangement, during positive excursions of the input signal, the first output transistor 16 will be driven into a conducting state by the non-inverted analog signal, while the second output transistor 18 is held in a non-conducting state by the inverted analog signal. Conversely, during negative excursions of the input signal, the first output transistor 16 is held in a non-conducting state by the non-inverted analog signal, whereas the second output transistor 18 is driven into a conducting state by the inverted analog signal.

The output transformer 6 comprises a primary winding 20 connected to the push-pull circuit 4 and a secondary winding 22 connected to an impedance load 24 which may, for example, be a conventional "local loop" telephone line. As shown in FIG. 1, the primary winding 20 comprises a pair of end taps 24,26 and a center tap 28. Each of the end taps 24,26 is connected to the collector of a respective one of the first and second output transistors 16,18. The emitter of each of the first and second output transistors 16,18 is connected to ground.

The center tap 28 is connected to the switch circuit 8 which is designed to enable the center tap 28 to be connected to a selected one of a pair of power supply rails 30, 32. Preferably, each of the power supply rails source direct current (DC) power having a common polarity (positive in the illustrated embodiment). One of the power supply rails 30 serves as a source of DC power at a high voltage (+VH), while the other power supply rail 32 provides DC power at a low voltage (+VL). Selection of the high or low voltage power supply rails 30, 32 is preferably accomplished by means of a control signal which may be internally generated (e.g. based on one or more of the inverted or non-inverted analog signals) or may be generated external to the dual supply power amplifier 2 (e.g. by a digital comparator as described in U.S. Pat. No. 6,028,486).

The secondary winding 22 of the output transformer is connected to produce an output analog signal ($V_O(t)$, and $I_O(t)$) through the impedance load 24. The operation of the dual supply power amplifier illustrated in FIG. 1 is described below with reference to FIGS. 2, and 3a–3d.

Figure 2:
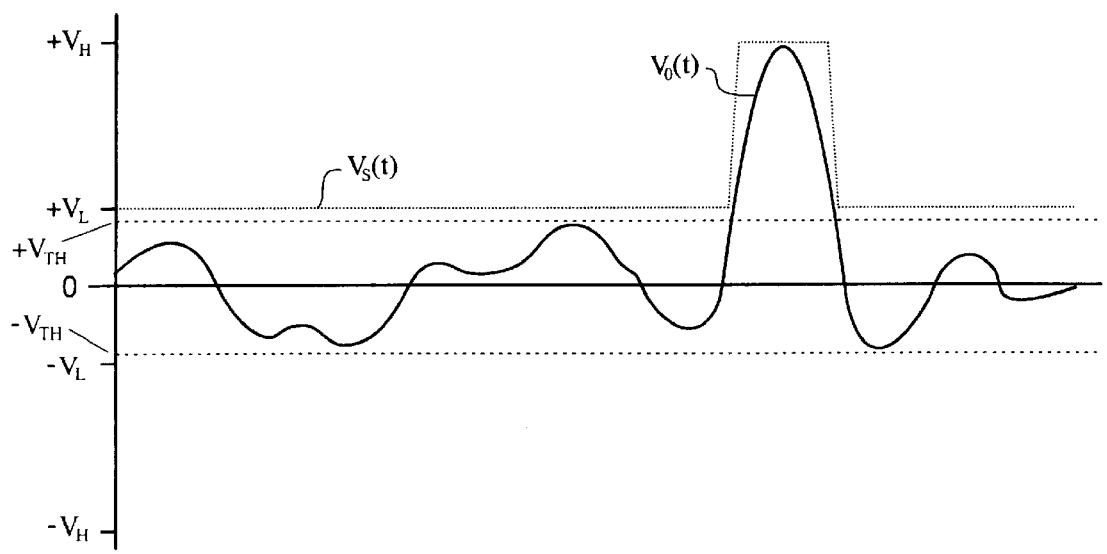
FIG. 2 is a graph illustrating a relationship between an input signal and supply voltage in the embodiment of FIG. 1.
Figure 3A:
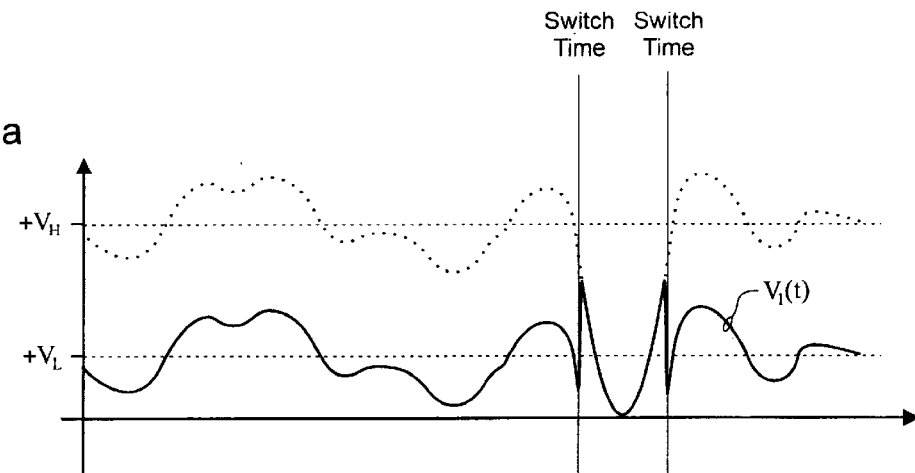
FIGS. 3a through 3d are graphs showing the voltage across, and the current through each output transistor of the embodiment of FIG. 1, for the input signal of FIG. 2.

FIG. 2 illustrates an exemplary segment of an output signal $V_O(t)$, and changes in the DC voltage $V_s(t)$ supplied to the center tap 28 of the primary winding 20 due to operation of the switch circuit 8. Thus, when the output signal $V_O(t)$ is at a low level (e.g. approximately equal to its RMS value) the switch circuit 8 is operated to connect the low voltage power supply (+VL) to the center tap 28 of the primary winding 20 (i.e. $V_s(t)=+VL$). However, when a peak in the output signal $V_O(t)$ is to be transmitted, the switch circuit 8 operates to connect the high voltage power supply (+VH) to the center tap 28 of the primary winding 20 (so that $V_s(t)=+VH$). The result of this operation, in terms of the voltage across the first output transistor 16 and the current through the first output transistor 16, respectively, is illustrated in FIGS. 3a and 3b.

In general, the voltage $V_1(t)$ across the first output transistor 16 is proportional to the difference between the voltage $V_s(t)$ supplied to the center tap 28 of the primary winding 20 and the instantaneous voltage of the output signal $V_O(t)$. Thus $V_1(t)=V_s(t)-k \cdot V_O(t)$, where k is the transformer ratio. In FIG. 3a, $V_1(t)$ is shown as a solid line. The dotted line shows $V_1(t)$ if $V_s(t)$ were held constant at +VH. The effect of switching $V_s(t)$ between +VL and +VH is clearly illustrated in FIG. 3a by the discontinuity in $V_1(t)$ at the switching times, which serves to prevent a negative excursion of $V_1(t)$, and consequent clipping or other distortion of the signal peak.

Figure 3B:
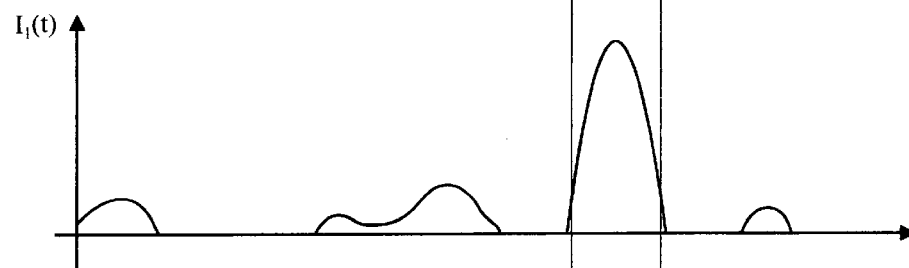

As shown in FIG. 3b, the current $I_1(t)$ through the first output transistor 16 is directly proportional to the instantaneous value of $V_1(t)$ during positive excursions of the non-inverted analog signal, and thus follows the positive excursions of the output signal $V_O(t)$. During negative excursions of the non-inverted analog signal, the current $I_1(t)$ through the first output transistor 16 is held constant at zero.

Figure 3C:
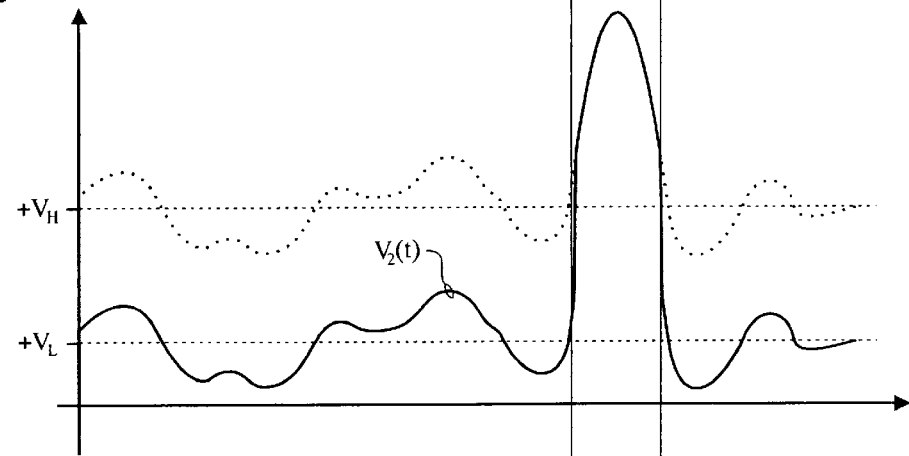
Figure 3D:
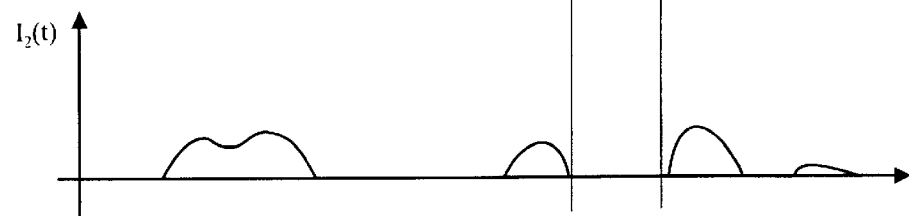

FIGS. 3c and 3d respectively show variations in the voltage $V_2(t)$ across the second output transistor 18 and the current $I_2(t)$ through the second output transistor 18 with variations in the input analog signal $V_{in}(t)$. As shown in FIG. 3c the voltage $V_2(t)$ across the second output transistor 18 is proportional to the sum the voltage $V_s(t)$ supplied to the center tap 28 of the primary winding 20 and the instantaneous voltage of the output signal $V_O(t)$. Thus $V_2(t)=V_s(t)+k \cdot V_O(t)$. Once again, the effect of switching $V_s(t)$ is clearly evidenced by the discontinuity in $V_2(t)$ between the switching times.

The current $I_2(t)$ through the second output transistor 18 is directly proportional to the instantaneous value of positive excursions of the inverted analog signal, and so follows the negative excursions of the output signal $V_O(t)$. During negative excursions of the inverted analog signal, the current $I_2(t)$ through the second output transistor 18 is held constant at zero.

As may be seen in particular from FIGS. 3b and 3d, the first output transistor 16 will be in a conducting state during positive excursions of the input analog signal $V_{in}(t)$, while the second output transistor 18 will be in a conducting state during negative excursions of the input analog signal $V_{in}(t)$. As a result, current flow within the primary winding 20 will alternate between a first current $I_1(t)$ from the center tap 28 to ground via the first output transistor 16, and a second current flow $I_2(t)$ from the center tap 28 to ground via the second output transistor 18. These alternating current flows induce the generation of a complete (i.e. alternating current—AC) output signal ($V_O(t)$, $I_O(t)$) by the secondary winding 22 which closely follows the input analog signal $V_{in}(t)$ received by the push-pull circuit 4. Since generation of the output signal is induced by alternating currents within the primary winding 20, and since these alternating currents run outward from the center tap 28, it is necessary to provide only a single polarity power source to the center tap 28. As a consequence, dual supply operation of the power amplifier 2 is obtained with only two power supply rails 30 and 32 (one each high and low voltage power supply).

Figure 4:
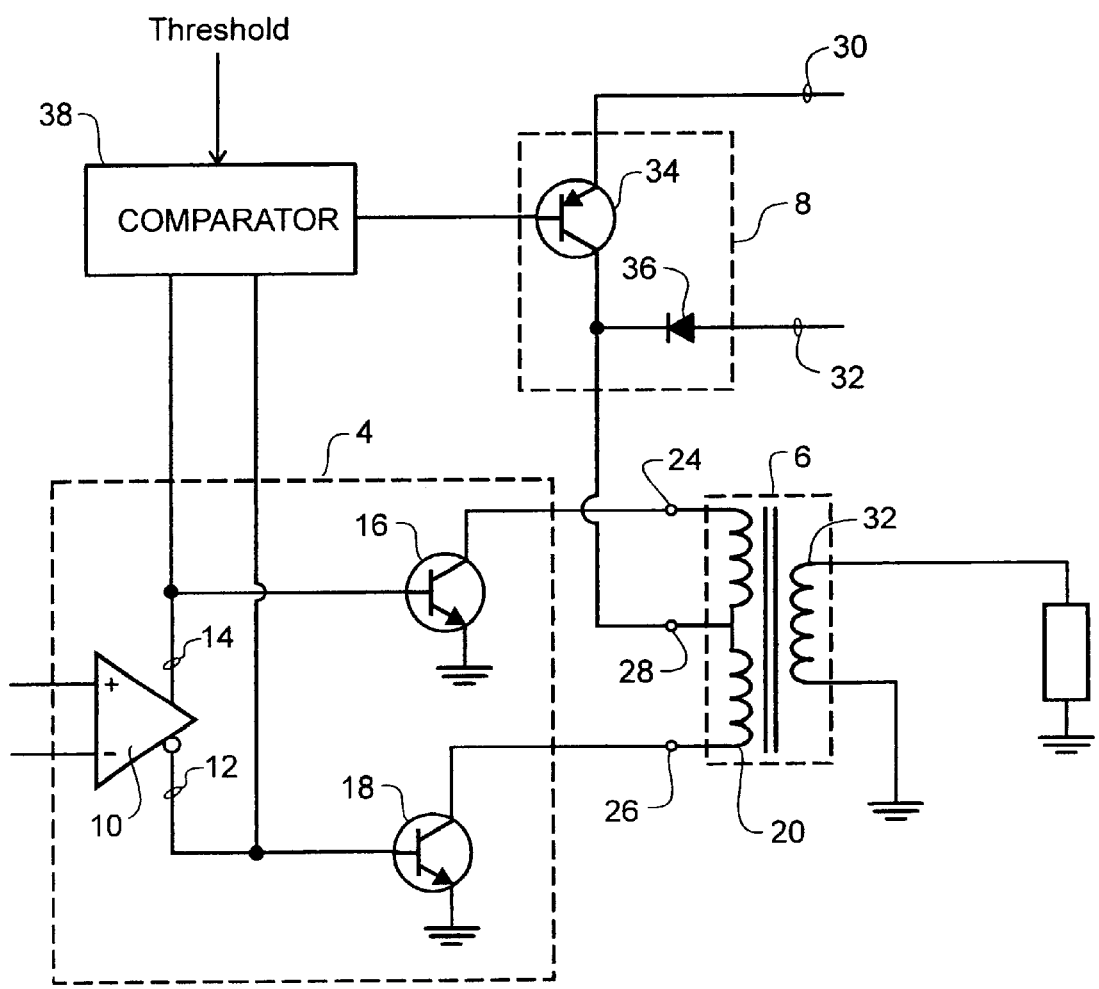
FIG. 4 is a schematic diagram illustrating a dual supply amplifier in accordance with a second embodiment of the present invention.

FIG. 4 shows an embodiment of the present invention in which the switch circuit 8 is provided by a pnp type transistor 34 having an emitter connected to the high voltage (+VH) power supply rail 30 and a collector connected to the center tap 28 of the primary winding 20. The pnp-type transistor 34 may be replaced by any suitable switching transistor, such as, for example, npn-type transistors or MOSFETs. The low voltage (+VL) power supply rail 32 is connected to the center tap 28 of the primary winding 20 via a diode 36 which prevents current flow between the high voltage and low voltage power supply rails 30, 32 when the transistor 34 is in a conducting state. The base of the transistor 34 is connected to a threshold comparator 38 which operates to compare the respective levels of the inverted and non-inverted analog signals to a predetermined threshold value $V_{TH}$ (See FIG. 1.). When the levels of the analog signals are lower than the threshold $V_{TH}$, the switch control signal generated by the threshold comparator 38 is negative (or zero) so that the transistor 34 is held in a non-conducting condition. In this case, the low voltage (+VL) power supply rail 32 supplies DC power to the center tap 28 of the primary winding 20 through the diode 36. When the positive excursions of either of the analog signals are above the threshold value $V_{TH}$, the switch control signal generated by the threshold comparator 38 is positive, which drives the transistor 34 into a conducting state. In this situation, the high voltage (+VH) power supply rail 30 supplies DC power to the center tap 28 of the primary winding 20 through the transistor 30.

It will thus be seen that a power amplified output signal is generated by the dual supply power amplifier 2 on the basis of a pair of single polarity power supplies, such that only two power supply rails 30 and 32 (e.g. one each for the two single polarity power supplies) need be provided for the dual supply power amplifier 2.

In the embodiments discussed above and illustrated in FIGS. 1–4, the push-pull circuit 4 comprises a pair of output transistors 16 and 18. It will be appreciated, however, that these output transistors 16 and 18 may be replaced by any suitable controlled current source. For example, the output transistors 16 and 18 may be replaced by any of the following devices:

open collector pnp-type transistors;
open collector npn-type transistors;
open collector Darlington pair;
open drain MOS or MOSFET transistors; and
open collector cascodes;

FIG. 4 illustrates an embodiment in which the switch 8 is controlled by a control signal generated by a threshold comparator 38, that operates to compare the inverted and non-inverted analog signals to a predetermined threshold value. However, it will be appreciated that the switch control signal may equally be generated by a digital comparator circuit that, for example, operates to compare an input digital signal to a predetermined threshold value, upstream of the power amplifier 2.

The embodiment(s) of the invention described above is(are) intended to be exemplary only. The scope of the invention is therefore intended to be limited solely by the scope of the appended claims.

We claim:

1. A power amplifier for receiving an input analog, signal and generating a corresponding output analog signal, the power amplifier comprising:
   a) first and second power supply rails capable of supplying power having respective first and second predetermined levels, and a single predetermined polarity;
   b) an amplifier circuit connected to receive the input analog signal and adapted to generate the output analog signal, the amplifier circuit comprising:
      i) a push-pull circuit connected to receive the input analog signal; and
      ii) an output transformer comprising a primary winding connected to the push-pull circuit, and selectively connectable to one of die first and second power supply rails via the switch circuit, and a secondary winding connected to the signal line for generating, the output analog signal; and
   c) a switch circuit adapted to selectively connect one of the first and second power supply rails to the amplifier circuit.

2. A power amplifier as claimed in claim 1 wherein the first predetermined level corresponds to a low voltage, and the second predetermined level corresponds to a high voltage.

3. A power amplifier as claimed in claim 1, wherein the push-pull circuit comprises:
   a) an input amplifier connected to receive the input analog signal, the input amplifier comprising an inverting output and a non-inverting output for generating respective inverted and non-inverted analog signals;
   b) a pair of current generators, a first one of the current generators being responsive to the non-inverting output of the input amplifier, and the other one of the current generators being responsive to the inverting output of the input amplifier.

4. A power amplifier as claimed in claim 3, wherein each one of the current generators comprises any one or more of: an open collector pnp-type transistor; an open collector npn-type transistor; an open collector Darlington pair; an open drain MOS or MOSFET transistor; and an open collector cascode.

5. A power amplifier as claimed in claim 3, wherein the primary winding of the output transformer comprises:
   a) a pair of end taps, each end tap being connected to a collector of a respective one of the current generators; and
   b) a center tap selectively connectable to one of the first and second power supply rails via the switch means.

6. A power amplifier as claimed in claim 2, wherein the switch circuit is responsive to a control signal to selectively connect one of the first and second power supply rails to the amplifier circuit.

7. A power amplifier as claimed in claim 6, wherein the control signal is based on a digital comparison between a level of a digital input signal and a predetermined threshold level, the switch circuit being adapted to connect the first power supply rail to the amplifier circuit when the level of the digital input signal is below the predetermined threshold, and to connect the second power supply rail to the amplifier circuit when the level of the digital input signal is above the predetermined threshold.

8. A power amplifier as claimed in claim 6, wherein the control signal is based on a comparison between a level of the input analog signal and a predetermined threshold level, the switch circuit being adapted to connect the first power supply rail to the amplifier circuit when the level of the input analog signal is below the predetermined threshold, and to connect the second power supply rail to the amplifier circuit when the level of the input analog signal is above the predetermined threshold.

9. A power amplifier as claimed in claim 8, wherein the control signal is generated by a comparator circuit adapted to compare the level of the input analog signal to the predetermined threshold level.

10. A power amplifier as claimed in claim 8, wherein the switch circuit comprises:
    a) a diode connected between the first power supply rail and the amplifier circuit; and
    b) a transistor having a base connected to receive the control signal, an emitter connected to the second power supply rail, and a collector connected to the amplifier circuit.

11. A modem comprising:
    a) a modulator for generating a modulated analog signal; and
    b) a line driver responsive to the modulated analog signal to generate a transmission signal Tx for transmission over a communications network, the line driver comprising:
       i) first and second power supply rails capable of supplying power having respective first and second predetermined levels, and a single predetermined polarity;
       ii) an amplifier circuit connected to receive the input analog signal and adapted to generate the output analog signal the amplifier circuit comprising:
          a push-pull circuit connected to receive the input analog signal; and
          an output transformer comprising a primary winding connected to the push-pull circuit, and selectively connectable to one of the first and second power supply rails via the switch circuit, and a secondary winding connected to the signal line for generating the output analog signal; and
       iii) a switch circuit adapted to selectively connect one of the first and second power supply rails to the amplifier circuit.

12. A modem as claimed in claim 11, wherein the push-pull circuit comprises:
    a) an input amplifier connected to receive the input analog signal, the input amplifier comprising an inverting output and a non-inverting output for generating respective inverted and non-inverted analog signals;
    b) a pair of current generators, a first one of the current generators being responsive to the non-inverting output of the input amplifier, and the other one of the current generators being responsive to the inverting output of the input amplifier.

13. A modem as claimed in claim 11, wherein the first predetermined level corresponds to a low voltage, and the second predetermined level corresponds to a high voltage.

14. A power amplifier as claimed in claim 12, wherein each one of the current generators comprises any one or more of: an open collector pnp-type transistor; an open collector npn-type transistor; an open collector Darlington pair; an open drain MOS or MOSFET transistor; and an open collector cascode.

15. A modem as claimed in claim 11, wherein the primary winding of the output transformer comprises:
   a) a pair of end taps, each end tap being connected to a collector of a respective one of the current generators; and
   b) a center tap selectively connectable to one of the first and second power supply rails via the switch circuit.

16. A modem as claimed in claim 13, wherein the switch circuit is responsive to a control signal to selectively connect one of the first and second power supply rails to the amplifier circuit.

17. A power amplifier as claimed in claim 16, wherein the control signal is based on a digital comparison between a level of a digital input signal and a predetermined threshold level, the switch circuit being adapted to connect the first power supply rail to the amplifier circuit when the level of the digital input signal is below the predetermined threshold, and to connect the second power supply rail to the amplifier circuit when the level of the digital input signal is above the predetermined threshold.

18. A modem as claimed in claim 16, wherein the control signal is based on a comparison between a level of the input analog signal and a predetermined threshold level, the switch circuit being adapted to connect the first power supply rail to the amplifier circuit when the level of the input analog signal is below the predetermined threshold, and to connect the second power supply rail to the amplifier circuit when the level of the input analog signal is above the predetermined threshold.

19. A modem as claimed in claim 18, wherein the control signal is generated by a comparator circuit adapted to compare the level of the input analog signal to the predetermined threshold level.

20. A modem as claimed in claim 18, wherein the switch circuit comprises:
   a) a diode connected between the first power supply rail and the amplifier circuit; and
   b) a transistor having a base connected to receive the control signal, an emitter connected to the second power supply rail, and a collector connected to the amplifier circuit.

* * * * *

UNITED STATES PATENT AND TRADEMARK OFFICE
CERTIFICATE OF CORRECTION

PATENT NO.    : 6,323,733 B1
DATED         : November 27, 2001
INVENTOR(S)   : Dan V. Gorcea et al.

It is certified that error appears in the above-identified patent and that said Letters Patent is hereby corrected as shown below:

<u>Column 7,</u>
Lines 8-27, claim 1 has been corrected to read:

1. A power amplifier for receiving an input analog[,] signal and generating a corresponding output analog signal, the power amplifier comprising:
   a) first and second power supply rails capable of supplying power having respective first and second predetermined levels, and a single predetermined polarity;
   b) an amplifier circuit connected to receive the input analog signal and adapted to generate the output analog signal; the amplifier circuit comprising:
      i) a push-pull circuit connected to receive the input analog signal; and
      ii) an output transformer comprising a primary winding connected to the push-pull circuit, and selectively connectable to one of [die] the first and second power supply rails via the switch circuit, and a secondary winding connected to the signal line for generating the output analog signal; and
   c) a switch circuit adapted to selectively connect one of the first and second power supply rails to the amplifier circuit.

Signed and Sealed this

Thirtieth Day of July, 2002

*Attest:*

*Attesting Officer*

JAMES E. ROGAN
*Director of the United States Patent and Trademark Office*